United States Patent
Lorenz et al.

(10) Patent No.: US 8,761,694 B2
(45) Date of Patent: Jun. 24, 2014

(54) MULTIPLE ANTENNA TRANSCEIVER

(75) Inventors: Robert G. Lorenz, Santa Clara, CA (US); Bertrand M. Hochwald, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 61 days.

(21) Appl. No.: 12/950,070

(22) Filed: Nov. 19, 2010

(65) Prior Publication Data

US 2012/0129469 A1 May 24, 2012

Related U.S. Application Data

(63) Continuation-in-part of application No. 12/689,058, filed on Jan. 18, 2010.

(51) Int. Cl.
*H04B 1/04* (2006.01)

(52) U.S. Cl.
USPC ............................ 455/103; 455/127.2; 455/78

(58) Field of Classification Search
USPC ............. 455/63.4, 66.1, 78, 84, 552.1, 553.1, 455/562.1, 101, 103, 127.2
See application file for complete search history.

(56) References Cited

U.S. PATENT DOCUMENTS

| | | | |
|---|---|---|---|
| 4,612,548 A | 9/1986 | Beltran | |
| 5,412,414 A | 5/1995 | Ast et al. | |
| 6,006,111 A | 12/1999 | Rowland | |
| 6,175,747 B1 * | 1/2001 | Tanishima et al. | 455/562.1 |
| 7,245,257 B1 | 7/2007 | Bruce et al. | |
| 7,248,656 B2 | 7/2007 | Da Silveira et al. | |
| 7,308,705 B2 | 12/2007 | Gordy et al. | |
| 7,450,065 B1 * | 11/2008 | Bruce et al. | 342/360 |
| 7,526,321 B2 | 4/2009 | Liu | |
| 7,616,704 B2 | 11/2009 | Li et al. | |
| 8,055,216 B2 | 11/2011 | Dent | |
| 2003/0179138 A1 | 9/2003 | Chen | |
| 2004/0014500 A1 | 1/2004 | Chun | |
| 2004/0017326 A1 | 1/2004 | Merrill | |
| 2004/0105509 A1 | 6/2004 | McGowan et al. | |
| 2004/0228422 A1 * | 11/2004 | Silveira et al. | 375/299 |

(Continued)

FOREIGN PATENT DOCUMENTS

| | | |
|---|---|---|
| CN | 101627551 A | 1/2010 |
| EP | 1 152 523 | 11/2001 |

(Continued)

OTHER PUBLICATIONS

European Search Report for European Patent Application No. EP 11 00 8934, European Patent Office, Rijswijk, Netherlands, mailed on Mar. 6, 2012.

(Continued)

*Primary Examiner* — Ping Hsieh
(74) *Attorney, Agent, or Firm* — Sterne, Kessler, Goldstein & Fox P.L.L.C.

(57) ABSTRACT

Embodiments for at least one method and apparatus of a multiple antenna transceiver are disclosed. One embodiment of the multiple antenna transceiver includes a multiport network having a plurality of first ports and a plurality of second ports, wherein at least one of the second ports is responsive to at least two of the first ports. The multiple antenna transceiver further includes a plurality of antennas, an antenna connected to each of the plurality of second ports. Another embodiment includes a multiple antenna subscriber unit architecture.

25 Claims, 13 Drawing Sheets

(56) References Cited

U.S. PATENT DOCUMENTS

| | | | |
|---|---|---|---|
| 2007/0135167 A1* | 6/2007 | Liu | 455/562.1 |
| 2007/0173277 A1 | 7/2007 | Yun | |
| 2008/0153433 A1 | 6/2008 | Pallonen et al. | |
| 2010/0214017 A1* | 8/2010 | Couchman et al. | 330/124 D |
| 2010/0285752 A1* | 11/2010 | Lakshmanan et al. | 455/63.1 |
| 2011/0110346 A1* | 5/2011 | Kim et al. | 370/338 |
| 2011/0195670 A1 | 8/2011 | Dakshinamurthy et al. | |
| 2011/0201283 A1 | 8/2011 | Lorenz et al. | |

FOREIGN PATENT DOCUMENTS

| | | | |
|---|---|---|---|
| TW | 200723902 A | 6/2007 | |
| WO | WO 2011/088452 | 7/2011 | |
| WO | WO 2011/097651 | 8/2011 | |
| WO | WO 2011/097652 A1 | 8/2011 | |

OTHER PUBLICATIONS

Non-Final Rejection mailed Mar. 1, 2012 for U.S. Appl. No. 12/689,058, filed Jan. 18, 2010; 16 pages.

International Search Report for International Application No. PCT/US2011/021536, United States Patent and Trademark Office, United States, mailed on Apr. 4, 2011.

International Search Report for International Application No. PCT/US2011/024111, United States Patent and Trademark Office, United States, mailed on May 6, 2011.

Office Action for related Chinese Patent Application No. 201110371690, mailed Jan. 6, 2014; 7 pages.

* cited by examiner

MULTIPLE ANTENNA TRANSCEIVER

FIELD OF THE DESCRIBED EMBODIMENTS

The described embodiments relate generally to wireless communications. More particularly, the described embodiments relate to a multiple-antenna transceiver.

BACKGROUND

Conventional wireless systems employ radio-frequency (RF) transmitters to produce an output signal that can be applied to an antenna for communication between stations separated by some distance. In mobile wireless networks, one station may be a mobile station (MS), whereas another station may be a base station (BS). As the MS moves throughout the coverage area of the wireless network, the path loss between the MS and the BS changes due to a number of factors including the change in distance between the stations as well as the presence of objects in the environment that serve to obstruct or attenuate the signals traveling from one station to the other.

To ensure proper network operation, the BS instructs the MS to increase or decrease its transmit power as required to overcome the path loss between the MS and BS so that the BS will continue to receive the MS signals as channel conditions change. The MS must maintain a certain signal strength at the BS so as not to inhibit detection of its transmited signals. Depending upon the details of the physical environment between the MS and BS, at some critical distance from the BS the MS will no longer be able to increase its output power to maintain the required signal strength. At that point, communication between the MS and BS can no longer be maintained and the link will be dropped unless the BS is able to hand-off communication with the MS to a neighboring BS. Therefore, the maximum output power capability of the MS is a critical parameter that ultimately determines the expected distance over which the MS and BS can communicate and thereby the number and spacing of BS sites that is required to provide reliable coverage in a mobile network. However, the greater the number of BS sites, the greater the cost to implement the mobile network. Accordingly, there is a need to maximize the output power capability of the MS to ensure reliable coverage with a minimum of required BS sites.

Therefore, a critical component in a MS is the power amplifier that is used to transmit the signal to the BS. A power amplifier typically has a maximum output power rating. One method to attain reliable communication with a BS is to ensure that the power amplifier is equipped with sufficient power to overcome the fading and otherwise poor environment that is sometimes present in a wireless medium.

However, it is not always feasible to equip an MS with a high-power amplifier for several reasons: (i) there is a limit on the total power that may be consumed by the device; (ii) a high-power amplifier may get excessively warm and be inefficient; (iii) a high-power amplifier may be expensive; (iv) a high-power amplifier may be too large to fit within the size constraints of a small mobile terminal.

In an effort to increase the output power of the MS, rather than increase the power of an existing amplifier, it is sometimes economical and efficient to combine one or more lower-power amplifiers. Combining the outputs of multiple amplifiers may afford additional advantages, including the ability to transmit either a single spatial stream or a plurality of spatial streams.

It is desirable to have a method of optimizing transmission power of multiple power amplifiers of subscriber station transceivers that have multiple antennas.

SUMMARY

An embodiment includes a multiple antenna transceiver. The multiple antenna transceiver includes a multiport network having a plurality of first ports and a plurality of second ports, wherein at least one of the second ports is responsive to at least two of the first ports. The multiple antenna transceiver further includes a plurality of antennas, each antenna connected to a second port.

Another embodiment includes a multiple antenna subscriber unit.

Another embodiment includes a method of operating a transceiver that includes a multiport network. The method includes coupling a plurality of transmit signals into a plurality of first ports of the multiport network, and a plurality of antennas, each antenna coupled to a second port of the multiport network, wherein at least one of the second ports is responsive to at least two of the first ports.

Other aspects and advantages of the described embodiments will become apparent from the following detailed description, taken in conjunction with the accompanying drawings, illustrating by way of example the principles of the described embodiments.

DETAILED DESCRIPTION

The embodiments described include systems, methods, and apparatuses of a transceiver architecture that includes a multiport network and multiple antennas.

Figure 1:
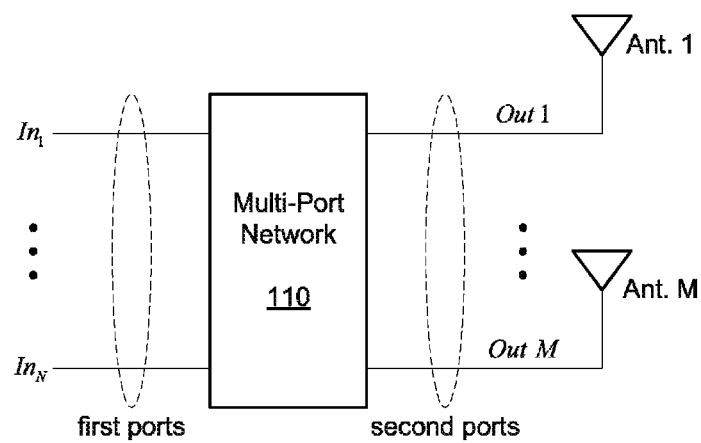
FIG. 1 shows an example of a block diagram of a transceiver that includes a multiport network and multiple antennas.

FIG. 1 shows an example of a block diagram of transceiver architecture that includes a multiport network 110, and multiple antennas Ant. 1 through Ant. M. As shown, the multiport network 110 includes N input ports and M output ports. Each of the M antennas are connected to a separate output of the multiport network 110. When transmitting, each of the N input ports is driven by a corresponding transmit signal. As will be described, the transmit signals can be preprocessed before being input to the multiport network, wherein the preprocessing adjust the amplitude and/or the phase of the transmit signals. While the multiport network 110 is depicted as having N inputs and M outputs, any subset of the inputs and/or outputs can be utilized. Here, the terms input and output are used for the purpose of explaining the operation of the multiport network. It is to be understood that the multiport network is a bidirectional device; this property will be used explicitly in the discussion of FIG. 8. The ports are labeled more generally in FIG. 1 as first ports and second ports.

A scattering parameter (S-parameter) describes a ratio of amplitudes of the output and input of linear electrical network. S-parameters are unit-less complex numbers that vary with frequency, and may represent gain and phase. The S-parameter matrix describing an N-port network is a square matrix of dimension N.

The S-parameter matrix for a 2-port network is commonly used to describe the relationship between the reflected, incident power waves according to:

$$\begin{bmatrix} O_1 \\ O_2 \end{bmatrix} = \begin{bmatrix} S_{11} & S_{12} \\ S_{21} & S_{22} \end{bmatrix} \begin{bmatrix} I_1 \\ I_2 \end{bmatrix},$$

where $O_1$ and $O_2$ are the outputs and $I_1$ and $I_2$ are the inputs. Equivalently, $O_1 = S_{11}I_1 + S_{12}I_2$ and $O_2 = S_{21}I_1 + S_{22}I_2$. The transfer function of the multiport network 110 may be represented by a matrix of S-parameters.

Figure 2:
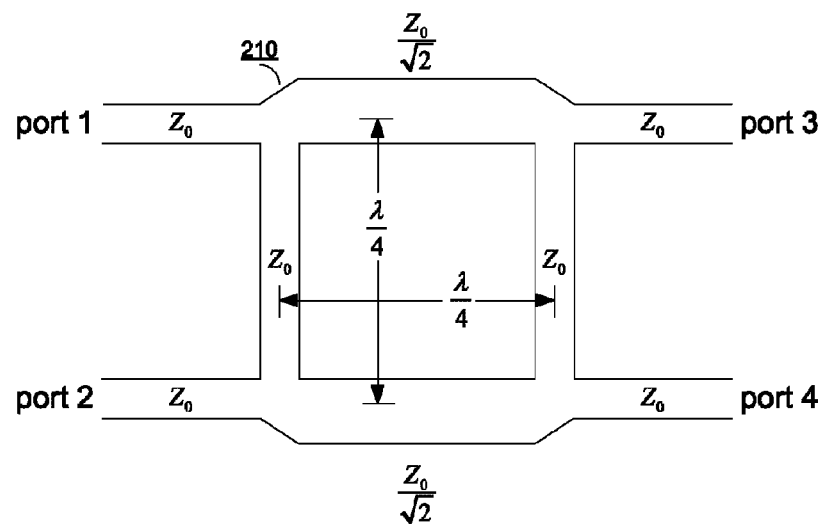
FIG. 2 shows an example of an implementation of a multiport network.

FIG. 2 shows an example of an implementation of a multiport network that is commonly referred to as a 90 degree hybrid coupler. For this exemplary embodiment, consider ports 1 and 2 as inputs and ports 3 and 4 as outputs. The 90 degree hybrid coupler 210 may be realized using transmission lines with electrical lengths and characteristic impedances as shown. Here, $Z_0$ denotes a characteristic impedance, typically 50 ohms;

$$\frac{\lambda}{4}$$

is a quarter wavelength line at the transmit center frequency.

The 90 degree hybrid coupler has nominal scattering parameters given by $$[S] = \frac{-1}{\sqrt{2}} \begin{bmatrix} 0 & j & 1 & 0 \\ j & 0 & 0 & 1 \\ 1 & 0 & 0 & j \\ 0 & 1 & j & 0 \end{bmatrix} \quad (1)$$

Let $$x = \begin{bmatrix} x_1 \\ x_2 \end{bmatrix}$$

be inputs to the hybrid, wherein $x_1$ denotes the signal applied to port 1 and $x_2$, the signal applied to port 2. Similarly, let $$y = \begin{bmatrix} y_1 \\ y_2 \end{bmatrix}$$

be outputs to the hybrid, wherein $y_1$ denotes the signal present at port 3 and $y_2$, the signal present at port 4. Using equation (1), the nominal relationship between the vector of inputs x and the vector of outputs, y, is given by y=Ax where:

$$A = \frac{-1}{\sqrt{2}} \begin{bmatrix} j & 1 \\ 1 & j \end{bmatrix} \quad (2)$$

The 90 degree hybrid coupler 210 is a linear, time invariant, passive, non-ferromagnetic circuit. Assume that the impedances seen by multiport by degree hybrid coupler 210 are nominal. Then, the following voltage relationship also holds:

$$x = A^T y \in \mathbb{C}^2, \quad (3)$$

where, $\mathbb{C}$ denotes the field of complex numbers. Hence, under the above assumptions, the 90 degree hybrid coupler is a bidirectional device and that the transfer function from one port to another does not depend on which is the input or output.

Figure 3:
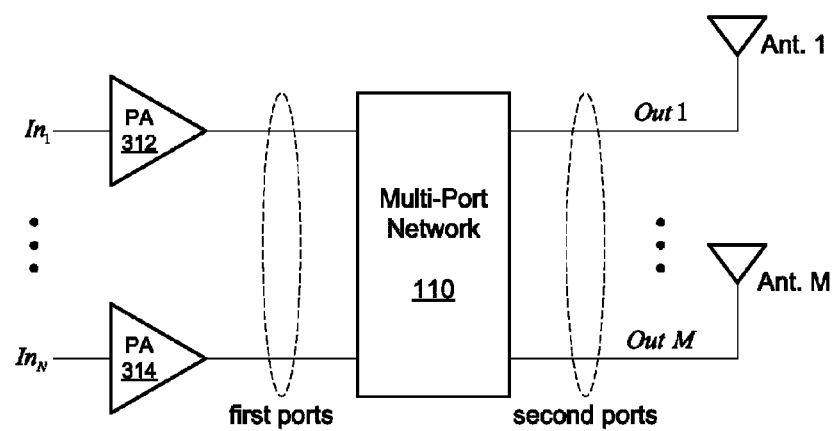
FIG. 3 shows an example of a block diagram that includes a plurality of power amplifiers, a multiport network, and multiple antennas.

FIG. 3 shows an example of a block diagram of a transceiver that includes a plurality of transmit input signals ($In_1 \ldots In_N$), power amplifiers 312 and 314, a multiport network 110, and multiple antennas Ant. 1, Ant. M. For an embodiment, the transmit input signals are amplified by power amplifiers 312 and 314 and applied to a plurality of first ports of the multiport network 110. A plurality of transmit antennas, Ant. 1 through Ant. M, are connected to a plurality of second ports of multiport network 110. An embodiment of the multiport network is the 90 degree hybrid coupler 210.

Embodiments include preprocessing the transmit input signals to establish phase relationships between the amplified signals received by the multiport network 110. This phase relationship may be chosen to produce an improved Signal-to-Noise Ratio (SNR) at the base station (BS) that the transceiver (for example, a subscriber) is communicating with. In a Time Division Duplex (TDD) system, the SNR the base station (BS) can be predicted from the received downlink signal; that is, from the signal received at the subscriber when receiving the transmitted signal from the BS.

Alternately, the phase relationship may be adjusted in response to a request from the BS. The phase relationships may be selected on a frequency selective basis. For example, in an OFDM (Orthogonal Frequency Division Multiplexing) system including a plurality of subcarriers, the phase can be adjusted on a subcarrier-by-subcarrier basis. In an alternate embodiment, a common phase relationship can be used for all subcarriers. Additionally or alternatively, the phase relationships can be adjusted dynamically.

For an embodiment, the selection of the phase relationships in combination with the multiport network 110, essentially results in a selection of one of the transmit antennas (Ant. 1 through Ant. M) in which the majority of the transmission signal power is directed. As described, the number of antennas is not limited, and the subset of antennas in which the signal power is directed is not limited to one. As described, the antenna selection can be adaptively made over both subcarriers and time (symbols) of multicarrier signals.

For another embodiment, selection of the phase and amplitude relationships in combination with the multiport network 110, essentially results the formation of beam-formed signals at the output of the plurality of antenna. As described, the number of antennas is not limited. As described, the antenna selection can be adaptively made over both frequency (subcarriers) and time (symbols) of multicarrier signals.

For an embodiment, the multiport network 110 may be a 90 degree hybrid coupler, 210, as shown in FIG. 2. In this embodiment, ports 1 and 2 of the multiport network are connected to the outputs of power amplifiers 312 and 314 respectively. Ports 3 and 4 of the multiport network are connected to Ant1 and Ant2, respectively.

For descriptive purposes, assume that power amplifier 312 and power amplifier 314 each have a complex gain $g=ke^{j\theta}$ and that the 90 degree hybrid coupler has a matrix transfer function given by (2). Let $x_1(f)=w_1 s(f) \in \mathbb{C}^2$, denote a vector signal applied to the inputs of the power amplifiers, where $$w_1(f) = \begin{bmatrix} j \\ -1 \end{bmatrix}, \quad (4)$$

denotes a vector of weights and s(f) is a frequency selective signal. In this case, the vector of outputs of 90 degree hybrid coupler 210 is given by:

$$y_1(f) = Ax_1(f) \quad (5)$$
$$= Aw_1(f)s(f)$$
$$= \frac{1}{\sqrt{2}} \begin{bmatrix} -j & -1 \\ -1 & -j \end{bmatrix} \begin{bmatrix} ke^{j\theta} & \\ & ke^{j\theta} \end{bmatrix} \begin{bmatrix} j \\ -1 \end{bmatrix} s(f)$$
$$= \sqrt{2} ke^{j\theta} \begin{bmatrix} 1 \\ 0 \end{bmatrix} s(f).$$

Observe that all of the power is applied to Ant. 1 and this power is twice the power as the signal produced by each of the power amplifiers. Similarly, if the vector signal applied to the power amplifiers is given by $x_2(f)=w_2 s(f) \in \mathbb{C}^2$, with $$w_2(f) = \begin{bmatrix} -1 \\ -j \end{bmatrix}, \quad (6)$$

the resulting vector of outputs of the 90 degree hybrid coupler is given by:

$$y_2(f) = Ax_2(f) \quad (7)$$
$$= Aw_2(f)s(f)$$
$$= \frac{1}{\sqrt{2}} \begin{bmatrix} -j & -1 \\ -1 & -j \end{bmatrix} \begin{bmatrix} ke^{j\theta} & \\ & ke^{j\theta} \end{bmatrix} \begin{bmatrix} -1 \\ j \end{bmatrix} s(f)$$
$$= \sqrt{2} ke^{j\theta} \begin{bmatrix} 0 \\ 1 \end{bmatrix} s(f).$$

In this case, all of the power is applied to Ant 2. For clarity, the losses and imbalances in the hybrid have been neglected in the forgoing discussion. In practice, these losses and imbalances are considered and compensated for.

For a general multiport network, the vector signal at its input can be written:

$$x(f)=w(f)s(f). \quad (8)$$

There are two cases to consider. In a first case, $w(f) \in \mathbb{C}^N$ is a vector of weights which depend on frequency (or subcarrier index) f and $s(f) \in \mathbb{C}$ corresponds to the modulating signal. The weight vector w(f) has dimension equal to the number of multiport network inputs. In a second case, $w(f) \in \mathbb{C}^{N \times L}$ is a matrix of weights, $s(f) \in \mathbb{C}^L$ corresponds to the vector of modulating signals, and L is the number of spatial streams. It is to be understood that although the signals are represented in the frequency domain, it is typical for such signals to be converted to a time-domain representation before being transmitted.

Figure 4:
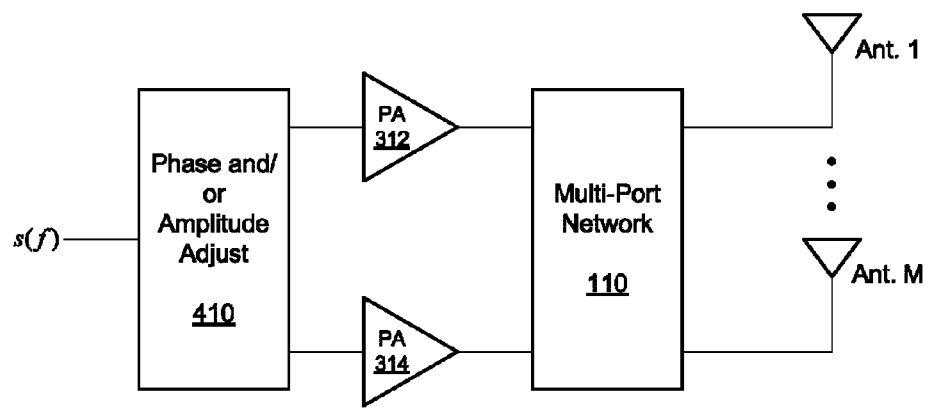
FIG. 4 shows an example of a block diagram that includes a plurality of power amplifiers, a multiport network, multiple antennas, and transmit signal phase and/or amplitude adjust circuitry.

FIG. 4 shows an example of a block diagram of a transceiver that includes a transmit signal adjust circuitry 410, a plurality of power amplifiers 312 and 314, a multiport network 110, and multiple antennas. The transmit signal adjust circuitry 410 is used to adjust the phase and/or amplitude of the modulating signal $s(f) \in \mathbb{C}^L$ and produces outputs that are applied to the plurality of power amplifiers 312 and 314. The transmit signal adjust circuitry corresponds to the vector or matrix of weights w(f) in (8). The number of spatial streams, L may be 1 or more than 1. For an embodiment, the transmit signal adjust circuitry 410 is implemented with signal processing circuitry that enables the amplitude of each transmit signal and the phase relationships between the transmit signals to be dynamically adjusted. For another embodiment, the transmit signal adjust circuitry 410 is implemented with signal processing circuitry that produces transmit signals having a fixed amplitude relationship and a phase relationships between each of the transmit signals that may be dynamically adjusted. For yet another embodiment, the transmit signal adjust circuitry is implemented using a multiport network. For still another embodiment, the transmit signal adjust circuit is implemented using a 90 degree hybrid coupler; this embodiment will be further described in the discussion of FIG. 12.

Figure 5:
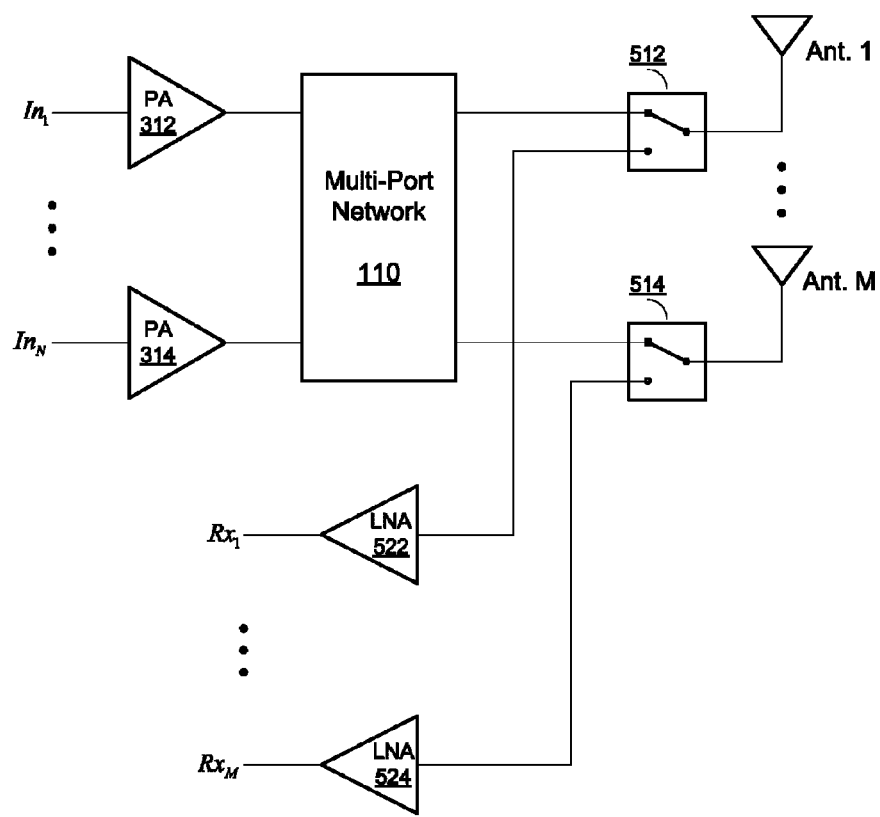
FIG. 5 shows an example of a block diagram of a transceiver that includes a plurality of power amplifiers, a multiport network, transmit/receive switches, low noise amplifiers, and multiple antennas.

FIG. 5 shows an example of a block diagram of a transceiver that includes a plurality of power amplifiers 312, 314, a multiport network 110, transmit/receive switches 512, 514, low noise amplifiers 522, 524, and multiple antennas. In this embodiment, the switches 512, 514 are connected between the plurality of second ports of the multiport network 110 and the antennas, Ant. 1, Ant. M. The switches can be used to provide a receive path that does not pass through the multiport network 110. As shown, the switches are also connected to low noise amplifiers 522, 524 to produce receive signals Rx$_1$, Rx$_M$, which are down-converted and subsequently processed.

In an embodiment, the signals applied to power amplifiers 312, 314, In$_1$, In$_N$, may be controlled to cause the majority of the transmit power to appear on one of the antenna for which the received signal amplitude is the greatest. In another embodiment, the signals may be processed such that the majority of the transmit power at each frequency is applied to the antenna whose RSSI is the greatest. In another embodiment, the signals applied to power amplifiers 312, 314 result in the majority of the power being sent to one antenna or another on a frequency selective basis, the selection being made on the basis of which antenna has the stronger received signal for that frequency.

Figure 6:
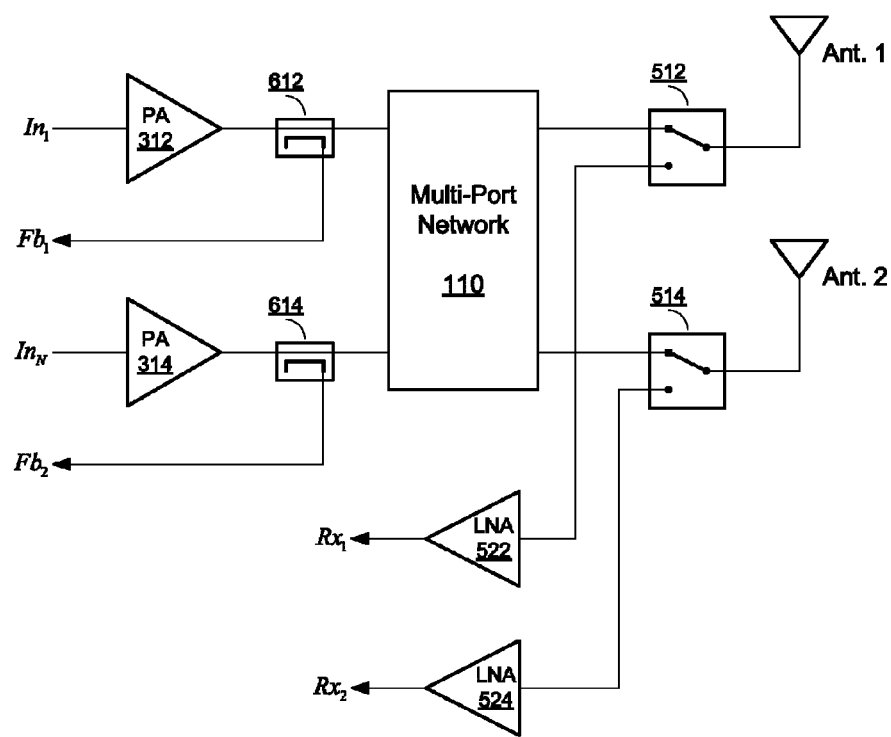
FIG. 6 shows an example of a block diagram of a transceiver that includes a plurality of power amplifiers, directional couplers, a multiport network, transmit/receive switches, low noise amplifiers, and multiple antennas.

FIG. 6 shows another example of a block diagram of a transceiver that includes a plurality of power amplifiers 312, 314, a plurality of directional couplers, 612, 614, a multiport network 110, multiple transmit/receive switches 512, 514, a plurality of low noise amplifiers 522, 524, and multiple antennas.

A first switch setting of transmit/receive switches 512, 514 connects the antennas to the plurality second ports of multiport network 110. This first switch setting, as shown in FIG. 6, is used when the subscriber station is transmitting. A second switch setting, used when the subscriber station is receiving, connects the antennas to low noise amplifiers 522, 524 to produce outputs Rx$_1$, Rx$_M$, which are subsequently down-converted and processed. Additionally, directional couplers 612, 614 redirect a small amount of power to produce feedback signals Fb$_1$, Fb$_N$ which can be used to aid preprocessing of the transmit signals. As shown, directional couplers 612, 614 are located between the power amplifiers 312, 314 and the first set of ports of the multiport network 110. These couplers allow the measurement of amplitude or phase of the transmit signal at the input of multiport network 110. In an implementation, the feedback signal outputs of the directional couplers Fb$_1$, Fb$_N$, which are used for aiding in the preprocessing of the transmit signals, have a power level that is approximately 18 dB below the power level of the input to the directional coupler.

Figure 7:
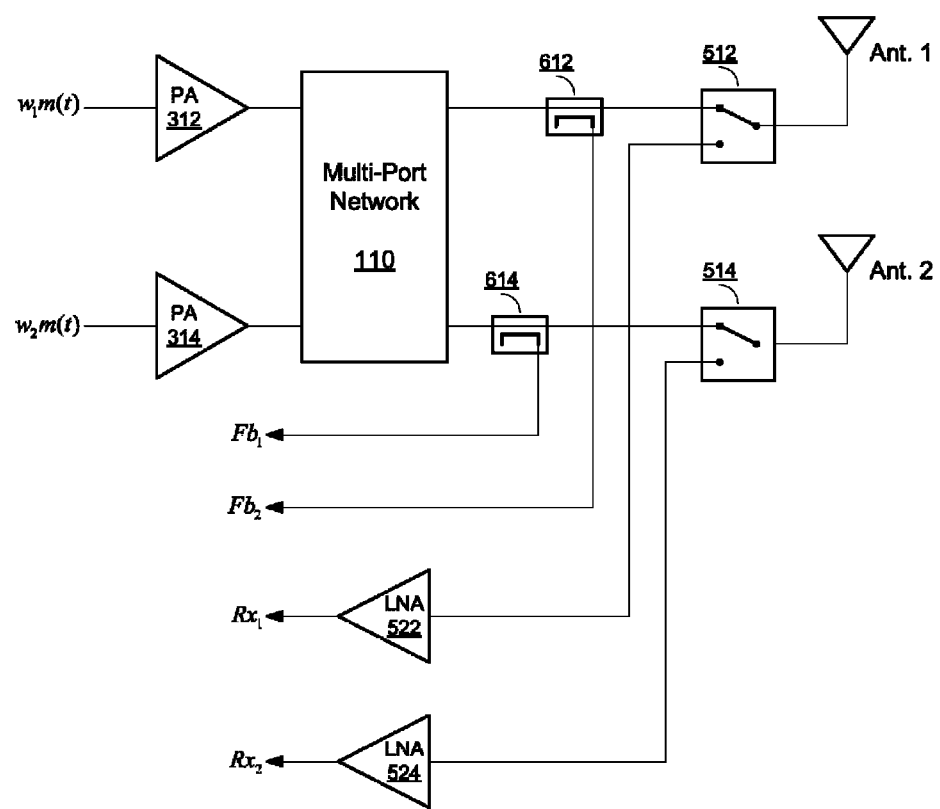
FIG. 7 shows another example of a block diagram of a transceiver that includes a plurality of power amplifiers, a multiport network, directional couplers, transmit/receive switches, low noise amplifiers, and multiple antennas.

FIG. 7 shows another example of a block diagram of a transceiver that includes a plurality of power amplifiers, a multiport network, directional couplers, transmit/receive switches, low noise amplifiers, and multiple antennas. FIG. 7 is similar to FIG. 6; however, the order of multiport network 110 and directional couplers 612, 614 is reversed. In this embodiment, the output of multiport network 110 is coupled, via directional couplers 612, 614, to feedback signals Fb$_1$, Fb$_N$. This allows the transmit signal processing to correct for any un-modeled or uncharacterized behavior of multiport network 110, hence reducing the calibration requirements and providing robustness to the un-modeled or uncharacterized behavior of multiport network 110.

Figure 8:
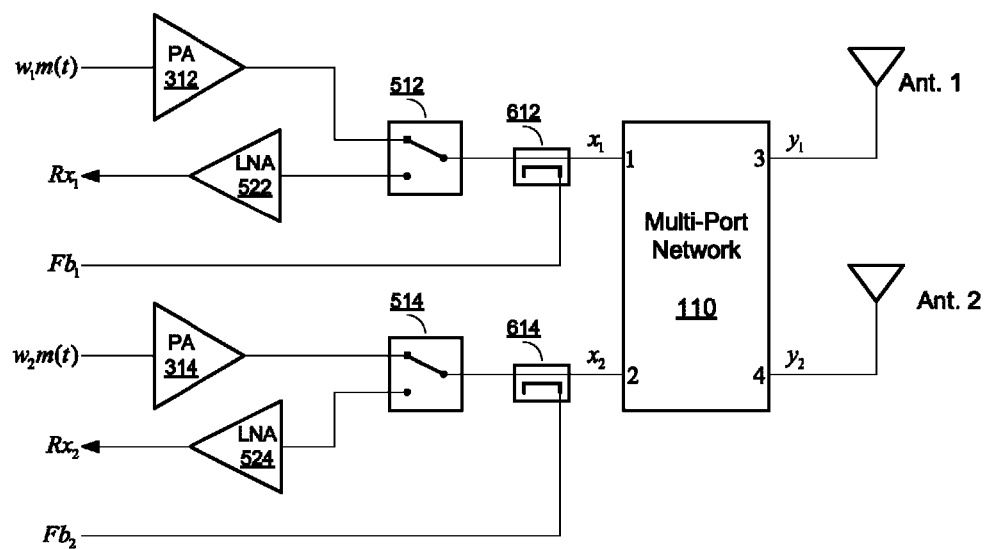
FIG. 8 shows another example of a block diagram of a transceiver that includes a plurality of power amplifiers, transmit/receive switches, low noise amplifiers, directional couplers, a multiport network, and multiple antennas.

FIG. 8 shows another example of a block diagram of a transceiver that includes a plurality of power amplifiers 312, 314, transmit receive switches 512, 514, low noise amplifiers 522, 524, directional couplers 612, 614, a multiport network, and multiple antennas. This embodiment includes directional couplers 612, 614 coupling a small portion of the transmit signals present at the plurality of first ports of multiport network 110 which can be used to aid preprocessing of transmit signals. Additionally, switches 512, 514 provide receive signal paths to low noise amplifiers 522, 524. In this embodiment, the signals received by the multiple receive antennas pass through the multiport network 110.

Let $$\breve{x}(t) = \begin{bmatrix} \breve{x}_1(t) \\ \breve{x}_2(t) \end{bmatrix} \in \mathbb{C}^2$$

vector of voltages at the ports 1 and 2 of multiport network 110 during reception with port 1 connected to directional coupler 612 and port 2 to directional coupler 614. Ports 1 and 2 of multiport network 110 are labeled, in FIG. 8, as x$_1$ and x$_2$, respectively. Let $$\hat{x}(t) = \begin{bmatrix} \hat{x}_1(t) \\ \hat{x}_2(t) \end{bmatrix} \in \mathbb{C}^2$$

denote a vector of voltages at the same ports during transmission. Similarly, let $$\breve{y}(t) = \begin{bmatrix} \breve{y}_1(t) \\ \breve{y}_2(t) \end{bmatrix} \in \mathbb{C}^2$$

denote a vector of voltages at ports 3 and 4 of the multiport network during. Here, port 3 is connected to Ant. 1 and port 4 to Ant. 2; they are labeled in FIG. 8 as y$_1$ and y$_2$, respectively. Let $$\hat{y}(t) = \begin{bmatrix} \hat{y}_1(t) \\ \hat{y}_2(t) \end{bmatrix} \in \mathbb{C}^2$$

denote a vector of voltages at the same ports during transmission. Assuming (again) that multiport network 110 is a linear, time invariant, passive, non-ferromagnetic circuit and that the impedances seen by multiport network 110 are nominal, the following voltage relationships hold:

$$\hat{y} = A\hat{x} \in \mathbb{C}^2 \tag{9}$$

and $$\breve{x} = A^T \breve{y} \in \mathbb{C}^2, \tag{10}$$

where $A \in \mathbb{C}^{2\times 2}$ is a matrix of scattering parameters. Let $\breve{h}(f, t) \in \mathbb{C}^2$ denote the vector channel from the base station to the ports 3 and 4 of multiport network 110. The apparent receive channel after the passing through the multiport network is given by:

$$\breve{x}(f,t) = A^T \breve{h}(f,t), \tag{11}$$

where $(\cdot)^T$ denotes the transpose. Let $\phi_{Rx,1}(f, t_{Rx}) = \measuredangle(\breve{x}_1(f, t_{Rx}))$ and $\phi_{Rx,2}(f, t_{Rx}) = \measuredangle(\breve{x}_2(f, t_{Rx}))$ denote the vector valued phases, indexed by frequency, of ports 1 and 2, respectively, at time $t_{Rx}$. Here, $\measuredangle(\cdot): \mathbb{C}^N \to [0, 2\pi)^N$ denotes the angle operator, and $t_{Rx}$ to an interval in the downlink subframe during which the receiver makes phase measurements. Similarly define $\phi_{Tx,1}(f) = \measuredangle(\hat{x}_1(f, t_{Tx}))$ and $\phi_{Tx,2}(f) = \measuredangle(\hat{x}_2(f, t_{Tx}))$ to be the vector valued phases, indexed by frequency, of ports 3 and 4, respectively, at time $t_{Tx}$, the time during which the subscriber is transmitting.

In an embodiment, the subscriber may control the phase relationship of the transmitted signals, during the transmit interval $t_{Tx}$ to satisfy the relationship:

$$\phi_{Tx,2}(f)-\phi_{Tx,1}(f)=-(\phi_{Rx,2}(f)-\phi_{Rx,1}(f)); \quad (12)$$

i.e., at each frequency, the difference of transmit phases between antennas is the negative of the difference of the receive phases. The transmitter computes a weighting vector:

$$w(f,t_{Rx}) = \begin{bmatrix} \frac{\breve{x}_1^*(f,t_{Rx})}{|\breve{x}_1(f,t_{Rx})|} \\ \frac{\breve{x}_2^*(f,t_{Rx})}{|\breve{x}_2(f,t_{Rx})|} \end{bmatrix} = \alpha \left| A^T \breve{h}(t_{Rx}) \right|^{-1} \cdot \left( A^T \breve{h}(t_{Rx}) \right) \quad (13)$$

to create an uplink signal $w(f, t_{Rx})m(t)$ which is applied to power amplifiers 312, 314. The outputs of power amplifiers 312, 314 are passed through transmit/receive switches 512, 514 and directional couplers 612, 614 to produce a vector signal at the multiport network 110:

$$\hat{x}(t) = \alpha w(f, t_{Rx})m(t) \quad (14)$$

where $\alpha$ is a complex constant related to a common amplitude and phase of the transmit signals into the multiport network 110. The output of the multiport network 110 is given by:

$$\hat{y}(t) = A\hat{x}(t) \quad (15)$$

Let $\hat{h}(f, t) = [\hat{h}_1(f, t) \; \hat{h}_2(f, t)]$ denote the uplink channel. The resulting uplink signal received at the base station is given by $$s(t) = \hat{h}(t)\hat{x}(t) \quad (16)$$
$$= \alpha \hat{h}(t) A w(t_{Rx})m(t)$$

For the same values of time and frequency, the uplink and downlink channels are reciprocal; namely, $\hat{h}(f, t) = \breve{h}^T(f, t) \in \mathbb{C}^{1 \times 2}$. For a transmit time $t_{Tx}$ sufficiently close to the receive measurement time $t_{Rx}$ sufficiently low mobility, $\hat{h}(f, t_{Tx}) \approx \breve{h}^T(f, t_{Rx})$. These conditions commonly hold in TDD cellular networks.

The benefits of this embodiment can be appreciated by considering the case in which $$\breve{h}(f, t_{Rx}) = \hat{h}^T(f, t_{Tx}) = \begin{bmatrix} h_1(f) \\ 0 \end{bmatrix}.$$

The effective channel seen by the receiver is given by $$\breve{x}(f) = \begin{bmatrix} A_{11} \\ A_{12} \end{bmatrix} h_1(f). \quad (17)$$

The transmit weight vector is given by $$w = \alpha \frac{h_1^*(f)}{|h_1(f)|} \begin{bmatrix} \frac{A_{11}^*}{|A_{11}|} \\ \frac{A_{12}^*}{|A_{12}|} \end{bmatrix}. \quad (18)$$

The transmit signal at the output of the multiport network is given by:

$$\hat{y} = Awm(t) \quad (19)$$
$$= A \begin{bmatrix} \frac{A_{11}^*}{|A_{11}|} \\ \frac{A_{12}^*}{|A_{12}|} \end{bmatrix} \left( \alpha \frac{h_1^*(f)}{|h_1^*(f)|} m(t) \right)$$
$$= \begin{bmatrix} |A_{11}| + |A_{12}| \\ \gamma \end{bmatrix} \left( \alpha \frac{h_1^*(f)}{|h_1^*(f)|} m(t) \right),$$

where m(t) is the modulating signal. The signal received at the base station is given by $$s = \hat{h}\hat{y} \quad (20)$$
$$= \alpha |h_1|(|A_{11}| + |A_{12}|)m(t).$$

As compared to the case without a hybrid, a voltage gain equal to in $|A_{11}|+|A_{12}|$ is realized over transmitting the same power from either or both of the power amplifiers without the hybrid. For the nominal 90 degree hybrid coupler, 210, $|A_{11}|+|A_{12}|=\sqrt{2}$ and the realized gain equals 3 dB.

If the same weight selection policy is employed and $$\breve{h}(f, t_{Rx}) = \hat{h}^T(f, t_{Tx}) = \begin{bmatrix} 0 \\ h_1(f) \end{bmatrix},$$

the signal received at the base station, using the same setup, is given by $$s = \hat{h}\hat{y} \quad (21)$$
$$= \alpha |h_2|(|A_{21}| + |A_{22}|)m(t).$$

In this case, a voltage gain of $|A_{21}|+|A_{22}|$ is realized as compared to transmitting the same power on each antenna without a multiport network. The gains of choosing the transmit phase relationship according to (12) are not limited to the case in which a strong imbalance exists between the amplitudes of the received signal. If the amplitudes are the same, array gain may be additionally realized.

In another embodiment, a common phase difference between the transmit signals is used for all frequencies.

Commonly, amplitude and phase differences exist in the transmit RF paths arising from one or more of the following factors: electrical delays, temperature, frequency, and calibration errors. The signals $Fb_1$ and $Fb_2$ are feedback signals that are subsequently processed and used to control the amplitude and or phase of the transmit signals. In an embodiment, the feedback signals may be correlated with the transmit signal m(t). In another embodiment, the power present in the feedback signals may be measured.

The outputs of low noise amplifiers 522 and 524 are downconverted, digitized, and processed using digital signal processing techniques to yield phases of the received signals, $\phi_{Rx,1}(f, t_{Rx})$ and $\phi_{Rx,2}(f, t_{Rx})$.

In another embodiment, calibration signals are applied to signals $Fb_1$ and $Fb_2$. These calibration signals couple through directional couplers 612, 614, transmit receive switches 512, 514 to the inputs of low noise amplifiers 522, 524. These amplified calibration signals can be down-converted and subsequently processed to measure the phase delays from each of the directional couplers 612, 614 to the respective outputs of the digital signal processing. These measured phase delays are used to compensate the measured phases of the received signals, $\phi_{Rx,1}(f, t_{Rx})$ and $\phi_{Rx,2}(f, t_{Rx})$.

Figure 9:
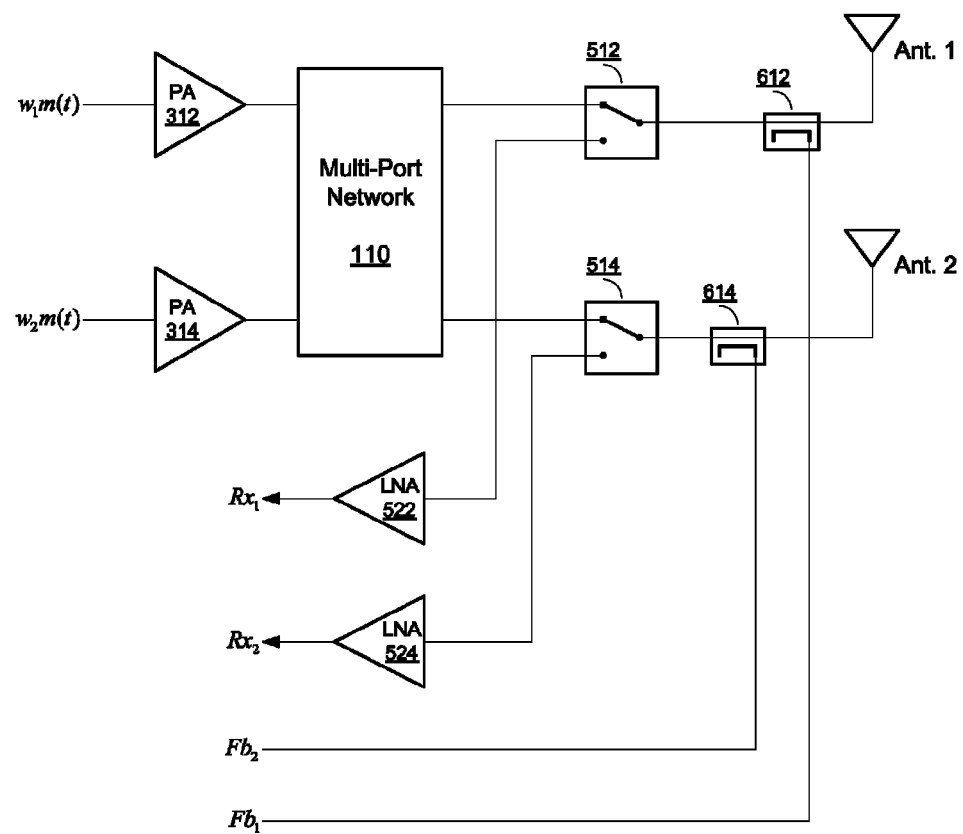
FIG. 9 shows another example of a block diagram of a transceiver that includes a plurality of power amplifiers, a multiport network, directional couplers, transmit/receive switches, low noise amplifiers, and multiple antennas.

FIG. 9 shows another example of a block diagram of a transceiver that includes a plurality of power amplifiers 312, 314, a multiport network 110, multiple antennas, switches 512, 514 and directional couplers 612, 614. In this embodiment, multiport network 110 is part of the transmit path but not a part of the receive path. Directional couplers 612, 614 are connected to the antennas. Portions of the transmit signals applied to Ant. 1, Ant. 2 are coupled, through directional couplers 612, 614 to produce feedback signals $Fb_1$ and $Fb_2$, which are subsequently processed to measure the phases of the signals transmitted by each of the antennas. In an embodiment, these feedback signals apply calibration signals to directional couplers 612, 614 to enable measurement of the phase delays from directional couplers 612, 614, through the low noise amplifiers 522, 524, the receive paths, and digital signal processing. This embodiment provides benefit in the event that the levels of interference present at each of the receive antennas differs substantially. Consider the case in which strong interference is present at the first antenna but not at the second, with the desired receive signal having comparable power at both antennas. In this case, an optimal receiver performance using the received signal passed through a multiport network is inferior to the performance without the multiport network as part of the receive path. Using a plurality of measurements, the embodiment in FIG. 9 enables the calibration of the transmit paths, the receive paths, and the characteristics of multiport network 110.

Figure 10:
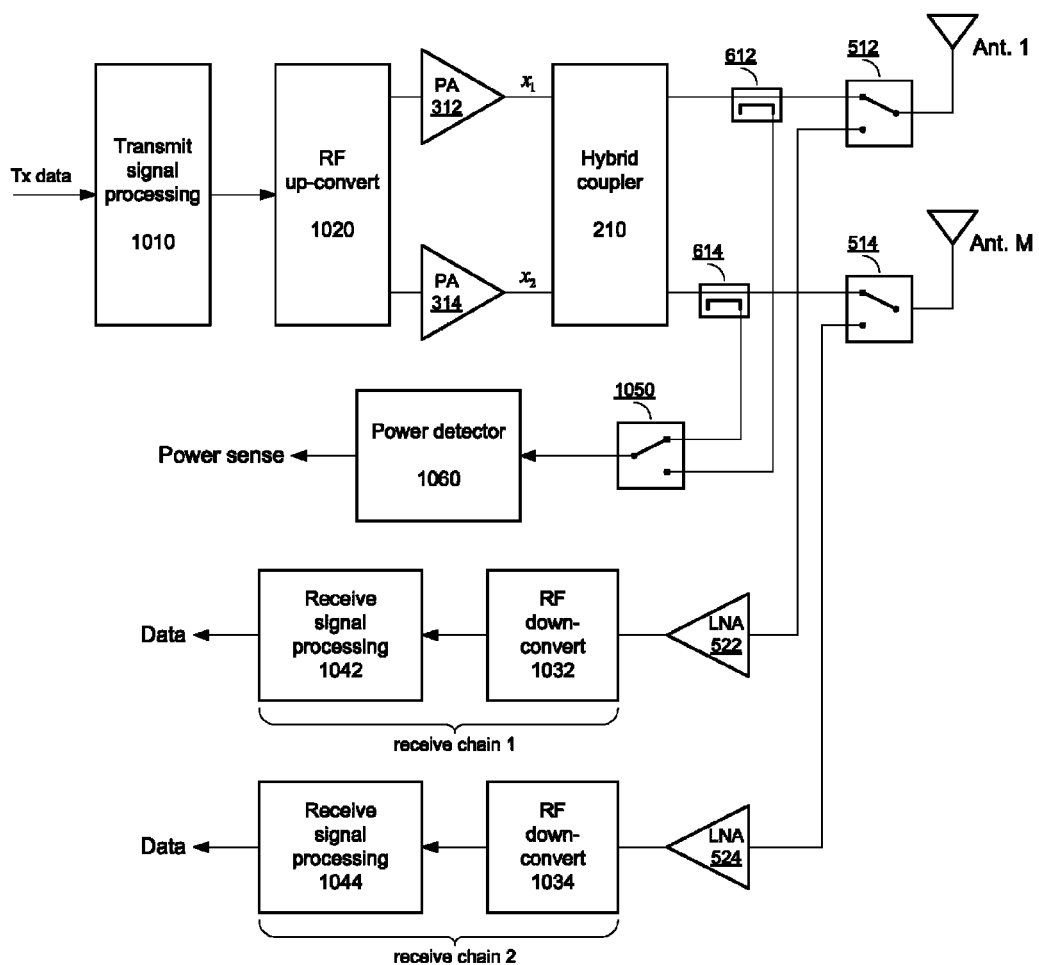
FIG. 10 shows an example of a block diagram of a transceiver that includes transmit and receive signal processing, a plurality of power amplifiers, directional couplers, a multiport network, transmit/receive switches, low noise amplifiers, and multiple antennas.

FIG. 10 shows an example of radio frequency circuitry connected to power amplifiers in an Orthogonal Frequency-Division Multiplexing (OFDM) system, where the transmit (Tx) data s(f) is applied to the input of transmit signal processing block 1010. The signal is processed and up-converted in frequency by the RF up-convert block 1020. The up-converted transmit signals are amplified by power amplifiers 312, 314 producing signals $x_1$ and $x_2$ which are applied to the input of hybrid coupler 210. The outputs of hybrid pass connect to antennas Ant. 1, Ant. 2 through directional couplers 612, 612 and transmit/receive switches 512, 514.

Additional outputs of directional couplers 612, 614 are coupled to switch 1050 which selects between said additional outputs. The selected additional output is applied to power detector 1060 which produces a power sense signal that is representative of the output power at the corresponding antenna. The power sense signal may be profitably used for controlling the amplitude and phases of the signals applied to power amplifiers 312, 314.

When receiving signals, the switches 512, 514 direct the received signals to the low noise amplifiers 522, 524. Receive data signal are generated by down-converters 1023, 1334, which frequency down-convert the receive signals, and receive signal processing 1042, 1044 processing the down-converted received signals.

An embodiment includes the at least one dynamically adjustable phase shifted signal being generated by dynamically adjusting at least one phase relationship of the transmission signal. That is, a second signal is generated that has a phase that differs from the transmission signal by the dynamically adjustable phase. The amplitude of the second (or more) signal may differ from the transmission signal for various reasons including amplitude imbalances in RF circuitry and the multiport network.

An embodiment includes directing a majority of signal power of the combined signals to a subset of the plurality of antennas, on a frequency selective basis, as determined by the adjusting of the at least one phase relationship between the transmission signal and the at least one dynamically adjustable phase shifted signal. This method may include determining a receiver antenna with the strongest receive signal and selecting that antenna for transmission. For this implementation, the desired antenna (or desired antennas) can effectively be selected (majority of signal power directed to) without having to physically switch and direct signal energy to the desired antenna. The phase relationships between the transmission signal and the dynamically adjustable phase shifted signal, and the combining of these signals within the multiport network results in direction of the combined signal energy to a subset of the plurality of antennas.

An embodiment includes the subset of plurality of antennas that the majority of signal power of the combined signals is directed being adaptively selected over time. That is, for example, the above-described antenna selection can be adaptively adjusted over time.

An embodiment includes the transmission signal and the at least one dynamically adjustable phase shifted signal being multi-carrier signals. Each of the multi-carrier signals includes a plurality of sub-carriers. Further, this embodiment can include adaptively directing signal power of the combined signals to a subset of plurality of antennas on a subcarrier-by-subcarrier basis. The subcarrier-by-subcarrier signal power direction can be determined by the adjusting of the at least one phase relationship between the transmission signal and the at least one dynamically adjustable phase shifted signal.

For an embodiment, the multi-port network includes a hybrid coupler that combines the amplified transmission signal and the amplified at least one dynamically adjustable phase shifted signal, and generates an output signal for each of the plurality of antennas. More generally, the multiport network includes combining the amplified transmission signals that includes delaying each amplified transmission signal before combining, wherein the delays are predetermined, generating a plurality of combined outputs, a combined output corresponding with each of the plurality of antennas.

An embodiment includes controlling the phase relationship between the transmission signal and the at least one dynamically adjustable phase shifted signal based on characterizing transmission channel qualities associated with each of the plurality of antennas. That is, adaptive selection the subset of the plurality of antennas that the signal power of the combined signals is directed is based on the characterized channel qualities. For an embodiment, the transmission channel qualities are characterized across the subcarriers of the multi-carrier signals. An embodiment includes characterizing the transmission channel qualities based on reception of signals through each antenna.

The transmission can include tiles that include multiple subcarriers of multiple multi-carrier symbols. An embodiment includes adaptively selecting the subset of the plurality of antennas that the majority of the signal power of the combined signals is directed based on a tile-by-tile basis.

For an embodiment, transmission channel qualities associated with each of the antennas includes characterizing pilot tones of a preamble of a downlink sub-frame of the at least one received signal. For a specific embodiment, characterizing the pilot tones of the preamble is based on subcarriers of the preamble corresponding to a group of subcarriers to be allocated during transmission. For another specific embodiment, characterizing the pilot tones of the preamble occurs over a range of subcarriers that overlap a group of subcarriers to be allocated to the subset of the plurality of antennas during transmission. The signal power of the groups of subcarriers of the multi-carrier signals can be directed to the subset of the plurality of antennas according to receive signal qualities of the characterized pilot tones.

Base station receive signal processing can include, for example, estimating the UL channel. This channel estimation commonly averages the pilots of a group of adjacent subcarriers for the purpose of reducing the effects of additive noise and interference. In general, the channels from the subscriber station antennas to the BS antennas are different in both amplitude and phase. To preclude introducing channel estimation errors due to averaging at the base station, embodiments include avoiding the separation of groups of subcarriers across subscriber antennas. For the WiMAX system, a useful grouping of subcarriers includes, for example, PUSC UL tiles, wherein PUSC refers to the Partial Usage of Subchannels. The Physical Resource Block (PRB) in the 3rd Generation Partnership Program Long-Term-Evolution (LTE) standard is another useful grouping of subcarriers.

It can be advantageous to assign transmit phase differences on a tile-by-tile basis. The UL tiles span a narrow range of frequencies. Therefore, the channel typically varies by only a small amount across the tile and the channel for all subcarriers within this group can be effectively characterized by a single metric. Additionally, the set of tiles that constitute a subchannel do not change during the UL subframe. This allows assignment of tiles to individual antennas without concern that subsequent assignment, on subsequent symbols, may result in the same tile being transmitted on different antennas on different symbols. This is true even in the case of, for example, subchannel rotation in, WiMAX systems. Subchannel rotation is described in section 8.4.6.2.6 of the IEEE 802.16 standard. Other useful grouping of subcarriers include the Band AMC bin in the WiMAX standard and.

Figure 11:
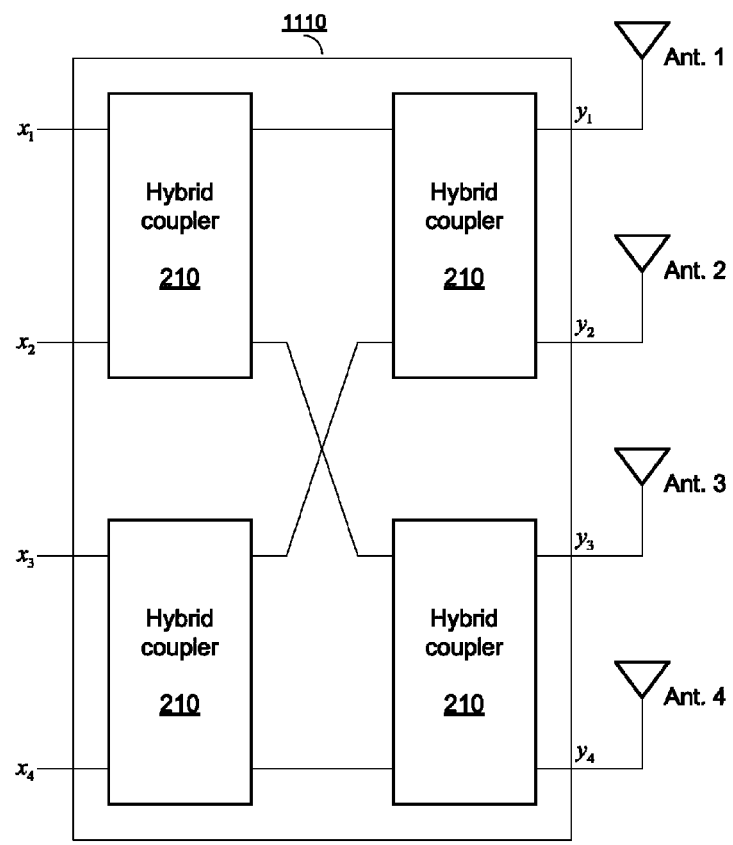
FIG. 11 shows an example of a block diagram that includes a plurality of power amplifiers, a multiport network, and more than two antennas.

FIG. 11 shows an example of a multiport network comprising multiple multiport networks. In this case, the number of transmitter paths and the number of antennas is greater than 2. Let $x=[x_1\ x_2\ x_3\ x_4]^T$ denote a vector of inputs to multiport network 1110 and let $y=[y_1\ y_2\ y_3\ y_4]^T \in \mathbb{C}^4$ denote a vector of outputs. Assume that the matrix transfer function of hybrid coupler 210 is as defined in (2). Then, the relationship between $x=[x_1\ x_2\ x_3\ x_4]^T$ is given by $y=Hx$ where $$H = \frac{1}{2}\begin{bmatrix} -1 & j & j & 1 \\ j & 1 & -1 & j \\ j & -1 & 1 & j \\ 1 & j & j & -1 \end{bmatrix}. \quad (22)$$

The matrix H is full rank, unitary, and all of the rows have constant $l_1$ norm. Hence, it is always possible to choose values of $x_1 \ldots x_4$ such that all of the power is delivered to any one antenna for a single layer spatial transmission. It is also possible to deliver all of the power to any two antennas for a spatial rate 2 transmission.

Figure 12:
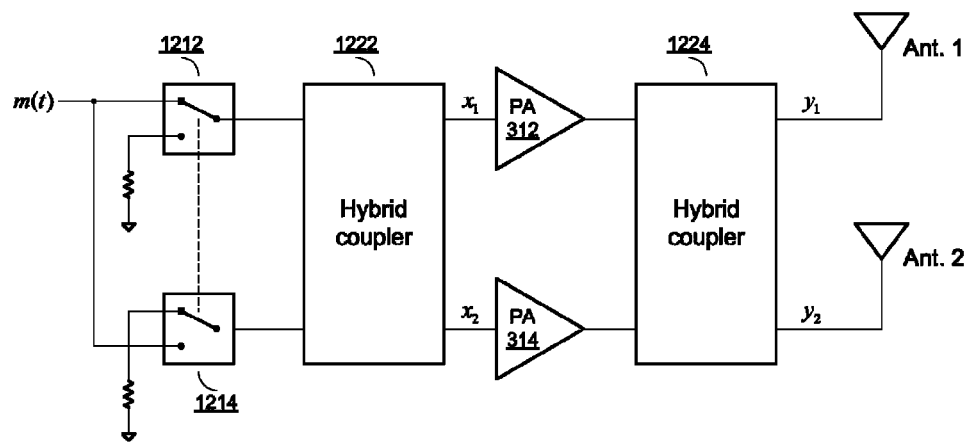
FIG. 12 shows an example of a block diagram that employs a plurality of power amplifiers and a plurality of quadrature hybrid couplers.

FIG. 12 shows an example of a block diagram of a transceiver that includes a plurality of switches 1212, 1214, a plurality of 90 degree hybrid couplers 1222, 1224, a plurality of power amplifiers 312, 314 and multiple antennas. Switches 1212, 1214 are controlled with a common signal. Taken together, switches 1212, 1214, and hybrid coupler 1222 correspond to transmit signal phase adjust circuitry, as previously described. Let $x_1$ and $x_2$ denote the outputs of hybrid coupler. With a hybrid coupler as described in (2) and switches 1212, 1214 in the position as shown, the output of hybrid coupler 1222 is given by:

$$\begin{bmatrix} x_1 \\ x_2 \end{bmatrix} = \frac{1}{\sqrt{2}}\begin{bmatrix} -j & -1 \\ -1 & -j \end{bmatrix}\begin{bmatrix} 1 \\ 0 \end{bmatrix}m(t) = \frac{1}{\sqrt{2}}\begin{bmatrix} -j \\ -1 \end{bmatrix}m(t). \quad (23)$$

The resulting output of hybrid coupler 1224 is given by:

$$\begin{bmatrix} y_1 \\ y_2 \end{bmatrix} = \left(\frac{1}{\sqrt{2}}\begin{bmatrix} -j & -1 \\ -1 & -j \end{bmatrix}\right)\left(\frac{1}{\sqrt{2}}\begin{bmatrix} -j \\ -1 \end{bmatrix}m(t)\right) = j\begin{bmatrix} 0 \\ 1 \end{bmatrix}m(t). \quad (24)$$

All of the power from the power amplifiers is seen to be applied to antenna 2.

Similarly, if switches 1212, 1214 are placed in positions opposite of that shown in FIG. 12, $$\begin{bmatrix} x_1 \\ x_2 \end{bmatrix} = \frac{1}{\sqrt{2}}\begin{bmatrix} -j & -1 \\ -1 & -j \end{bmatrix}\begin{bmatrix} 0 \\ 1 \end{bmatrix}m(t) = \frac{1}{\sqrt{2}}\begin{bmatrix} -1 \\ -j \end{bmatrix}m(t) \quad (25)$$

and the resulting output of hybrid coupler 1224 is given by:

$$\begin{bmatrix} y_1 \\ y_2 \end{bmatrix} = \left(\frac{1}{\sqrt{2}}\begin{bmatrix} -j & -1 \\ -1 & -j \end{bmatrix}\right)\left(\frac{1}{\sqrt{2}}\begin{bmatrix} -1 \\ -j \end{bmatrix}\right)m(t) = j\begin{bmatrix} 1 \\ 0 \end{bmatrix}m(t). \quad (26)$$

In this case, all of the power is applied to Ant. 1.

It is preferable to select the transmit antenna using this approach as compared to selecting between outputs $y_1$ and $y_2$. Overcoming the insertion loss of a switch, approximately 0.5 dB, would require an appreciable increase in power consumption. By switching the signal prior to power amplifiers 312, 314, the increase in power consumption is reduced.

Figure 13:
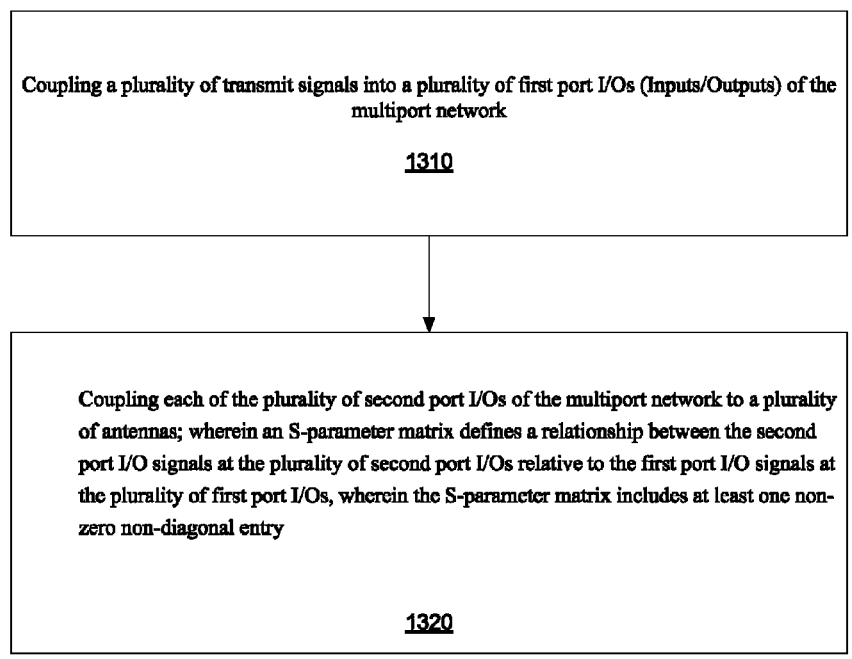
FIG. 13 shows a flow chart that includes steps of an example of a method of operating a transceiver that includes a multiport network.

FIG. 13 shows a flow chart that includes steps of an example of a method of operating a transceiver that includes a multiport network. A first step 1310 includes coupling a plurality of transmit signals into a plurality of first ports of the multiport network. A second step 1320 includes coupling each of the plurality of second ports of the multiport network to a plurality of antennas, wherein at least one of the second ports is responsive to at least two of the first ports.

For an embodiment, the method further includes setting at least one of phase and amplitude of the plurality of transmit signals forming at least one output transmit signal by controlling at least one of phase and amplitude of at least one of the transmit signals that pass through the multiport network based at least in part on the characterized received signals.

For an embodiment, the method further includes coupling a plurality of output power amplifiers to the first ports of the multiport network. A more specific embodiment includes setting a phase relationship of a plurality of transmit signals to direct a majority of transmit signal power to a selected subset of the plurality of antennas.

For an embodiment, the method further includes directionally coupling a transmit signal with a directional coupler, wherein an antenna is connected to a corresponding one the plurality of second ports through the directional coupler. A more specific embodiment includes a coupled output of the directional coupler being connected to transmit signal processing circuitry, the transmit signal processing circuitry adjusting at least one of phase and amplitude of transmit signals based on a coupling signal of the coupled output.

For an embodiment, the method further includes directionally coupling a transmit signal with a directional coupler, wherein a power amplifier is connected to a corresponding one the plurality of first ports through the directional coupler. A more specific embodiment includes a coupled output of the directional coupler being connected to transmit signal processing circuitry, the transmit signal processing circuitry adjusting at least one of phase and amplitude of transmit signals based on a coupling signal of the coupled output.

Although specific embodiments have been described and illustrated, the embodiments are not to be limited to the specific forms or arrangements of parts so described and illustrated.

What is claimed:

1. A multiple antenna transceiver, comprising:
    a multiport network having a plurality of first ports and a plurality of second ports, wherein at least one of the second ports is responsive to at least two of the first ports and the plurality of first ports are configured to receive a plurality of transmit signals;
    a plurality of antennas connected to the plurality of second ports; and
    processing circuitry configured to adjust at least one of a phase and amplitude of the plurality of transmit signals to form a plurality of corresponding adjusted transmit signals, wherein the multiport network is configured to form at least one output transmit signal by combining a transmit signal and a corresponding adjusted transmit signal, the output signal being output from the plurality of antennas, wherein the at least one of phase and amplitude are adjusted based on a wireless transmission channel characteristic associated with at least one of the plurality of antennas.

2. The multiple antenna transceiver of claim 1, further comprising a plurality of power amplifiers, wherein each power amplifier is connected to a first port.

3. The multiple antenna transceiver of claim 2, wherein the processing circuitry is configured to set a phase relationship of the plurality of transmit signals to direct a majority of transmit signal power to a selected subset of the plurality of antennas.

4. The multiple antenna transceiver of claim 2, wherein the processing circuitry is configured to set a phase and amplitude relationship of the plurality of transmit signals to direct a majority of transmit signal power to a selected subset of the plurality of antennas.

5. The multiple antenna transceiver of claim 2, further comprising a second multiport network, the second multiport network having a plurality of first ports and a plurality of second ports, wherein at least one of the second ports of the second multiport network is responsive to at least two of the first ports of the second multiport network, the second ports of second multiport network being connected to inputs of the power amplifiers.

6. The multiple antenna transceiver of claim 2, further comprising a directional coupler, wherein a power amplifier is connected to a corresponding one of the plurality of first ports through the directional coupler.

7. The multiple antenna transceiver of claim 6, further comprising a coupled output of the directional coupler being connected to the processing circuitry, the processing circuitry being configured to adjust the at least one of phase and amplitude of transmit signals based on a coupling signal of the coupled output.

8. The multiple antenna transceiver of claim 2, further comprising a switch, wherein a power amplifier is connected to a corresponding one the plurality of inputs through the switch.

9. The multiple antenna transceiver of claim 8, further comprising timing of control of the switch based upon time domain duplex (TDD) timing of transmit and receive signals.

10. The multiple antenna transceiver of claim 1, further comprising a directional coupler, wherein an antenna is connected to a corresponding one of the plurality of second ports through the directional coupler.

11. The multiple antenna transceiver of claim 10, further comprising a coupled output of the directional coupler being connected to the processing circuitry, the processing circuitry being configured to adjust the at least one of phase and amplitude of transmit signals based on a coupling signal of the coupled output.

12. The multiple antenna transceiver of claim 1, further comprising a switch, wherein an antenna is connected to a corresponding one the plurality of outputs through the switch.

13. The multiple antenna transceiver of claim 12, further comprising a switch output being connected to receive circuitry.

14. The multiple antenna transceiver of claim 13, further comprising timing of control of the switch based upon time domain duplex (TDD) timing of transmit and receive signals.

15. The multiple antenna transceiver of claim 1, further comprising means for receiving signals through the plurality of second ports, characterizing the received signals, and forming the at least one output transmit signal by controlling the at least one of phase and amplitude of at least one of the transmit signals that pass through the multipart network based at least in part on the characterized received signals.

16. The multiple antenna transceiver of claim 1, wherein the wireless transmission channel characteristic includes a characteristic of a pilot tone of a preamble of a downlink sub-frame of the at least one received signal.

17. The multiple antenna transceiver of claim 16, wherein the characteristic of the pilot tone is determined based on a group of subcarriers to be allocated to a subset of the plurality of antennas during transmission, the determination being over a range of subcarriers that overlaps the group of subcarriers.

18. A multiple antenna subscriber unit architecture, comprising:
    a multiport network having a plurality of first ports and a plurality of second ports, wherein at least one of the second ports is responsive to at least two of the first ports and the plurality of first ports are configured to receive a plurality of transmit signals;
    a plurality of antennas connected to the plurality of second ports; and
    processing circuitry configured to adjust at least one of a phase and amplitude of the plurality of transmit signals to form a plurality of corresponding adjusted transmit signals, wherein the multiport network is configured to form at least one output transmit signal by combining a transmit signal and a corresponding adjusted transmit signal, the output signal being output from the plurality of antennas, wherein the at least one of phase and amplitude are adjusted based on a wireless transmission channel characteristic associated with at least one of the plurality of antennas.

19. A method of operating a transceiver that includes a multiport network, comprising:
- coupling a plurality of transmit signals into a plurality of first ports of the multiport network;
- coupling a plurality of second ports of the multiport network to a plurality of antennas, wherein at least one of the second ports is responsive to at least two of the first ports; and
- setting at least one of phase and amplitude of the plurality of transmit signals to form a plurality of corresponding adjusted transmit signals, and to form at least one output transmit signal by combining a transmit signal and a corresponding adjusted transmit signal, wherein the setting is based on a wireless transmission channel characteristic associated with at least one of the plurality of antennas.

20. The method of claim 19, further comprising coupling a plurality of output power amplifiers to the first ports of the multiport network.

21. The method of claim 20, further comprising setting a phase relationship of the plurality of transmit signals to direct a majority of transmit signal power to a selected subset of the plurality of antennas.

22. The method of claim 19, further comprising directionally coupling a transmit signal with a directional coupler, wherein an antenna is connected to a corresponding one the plurality of second ports through the directional coupler.

23. The method of claim 22, further comprising a coupled output of the directional coupler being connected to processing circuitry, the processing circuitry adjusting the at least one of phase and amplitude of the plurality of transmit signals based on a coupling signal of the coupled output.

24. The method of claim 19, further comprising directionally coupling the transmit signal with a directional coupler, wherein a power amplifier is connected to a corresponding one the plurality of first ports through the directional coupler.

25. The method of claim 24, further comprising a coupled output of the directional coupler being connected to processing circuitry, the processing circuitry adjusting the at least one of phase and amplitude of the plurality of transmit signals based on a coupling signal of the coupled output.

* * * * *